United States Patent
Arnabat Benedicto et al.

(10) Patent No.: US 11,501,466 B2
(45) Date of Patent: Nov. 15, 2022

(54) COMPRESSED VERSIONS OF IMAGE DATA BASED ON RELATIONSHIPS OF DATA

(71) Applicant: HEWLETT-PACKARD DEVELOPMENT COMPANY, L.P., Spring, TX (US)

(72) Inventors: Jordi Arnabat Benedicto, Barcelona (ES); Jordi Vilar Benito, Barcelona (ES)

(73) Assignee: Hewlett-Packard Development Company, L.P., Spring, TX (US)

( * ) Notice: Subject to any disclaimer, the term of this patent is extended or adjusted under 35 U.S.C. 154(b) by 533 days.

(21) Appl. No.: 16/468,457

(22) PCT Filed: Mar. 22, 2017

(86) PCT No.: PCT/US2017/023574
§ 371 (c)(1),
(2) Date: Jun. 11, 2019

(87) PCT Pub. No.: WO2018/174868
PCT Pub. Date: Sep. 27, 2018

(65) Prior Publication Data
US 2021/0134017 A1    May 6, 2021

(51) Int. Cl.
*G06T 9/00*    (2006.01)
*H03M 7/30*    (2006.01)
*H03M 7/46*    (2006.01)

(52) U.S. Cl.
CPC ............ *G06T 9/00* (2013.01); *H03M 7/3066* (2013.01); *H03M 7/3071* (2013.01); *H03M 7/3077* (2013.01); *H03M 7/46* (2013.01); *H03M 7/6011* (2013.01)

(58) Field of Classification Search
CPC ..... G06T 9/00; H03M 7/3066; H03M 7/3071; H03M 7/3077; H03M 7/46; H03M 7/6011; H04N 19/88; H04N 19/593; H04N 19/80
See application file for complete search history.

(56) References Cited

U.S. PATENT DOCUMENTS

| | | |
|---|---|---|
| 5,689,591 A | 11/1997 | Balram et al. |
| 6,038,346 A | 3/2000 | Ratnakar |
| 7,894,531 B1 | 2/2011 | Cetin et al. |
| 8,265,401 B2 | 9/2012 | Yoshimura |
| 2004/0105590 A1 | 6/2004 | Akimoto et al. |

(Continued)

FOREIGN PATENT DOCUMENTS

| | | |
|---|---|---|
| EP | 3035683 | 6/2016 |
| WO | WO-2006105158 A2 | 10/2006 |

OTHER PUBLICATIONS

Deorowicz, S., Universal Lossless Data Compression Algorithms, 2003 < http://sun.aei.polsl.pl/~sdeor/pub/deo03.pdf >.

(Continued)

*Primary Examiner* — Christopher Wait
(74) *Attorney, Agent, or Firm* — HP Inc. Patent Department

(57) ABSTRACT

Methods of image compression are described. A stream of color image data is filtered with a prediction routine using a pixel neighborhood. The filtered stream of color image data is sorted with a block sorting routing. A version of the color image data is compressed based on the sorted and filtered stream of color image data.

15 Claims, 6 Drawing Sheets

(56) References Cited

U.S. PATENT DOCUMENTS

2010/0303354 A1    12/2010   Reznik
2013/0294707 A1    11/2013   Yomdin et al.
2017/0111660 A1*   4/2017   Midtskogen ........... H04N 19/51

OTHER PUBLICATIONS

Khalid Sayood, Data Compression, 2003, < https://pdfs.semanticscholar.org/42bd/05b17387d594182ba6283caa9724628ad46e.pdf >.
Klappenecker, A. et al., Lossless Compression of 3D MRI and CT Data, Nov. 13, 2007, < http://citeseerx.ist.psu.edu/viewdoc/download?doi=10.1.1.47.2660&rep=rep1&type=pdf >.
Pensiri, F., et al., A Lossless Image Compression Algorithm Using Predictive Coding Based on Quantized Colors, Apr. 2012, < http://www.wseas.org/multimedia/journals/signal/2012.

* cited by examiner

COMPRESSED VERSIONS OF IMAGE DATA BASED ON RELATIONSHIPS OF DATA

BACKGROUND

Data compression is the reversible re-encoding of information into a more compact expression of the data, i.e., compression reduces the number of bits of information that are used to represent information in a data fie or data stream. Data compression is used in the processes of transmitting and storing data to increase the transmission speed and reduce the storage requirements for the data.

DETAILED DESCRIPTION

In the following description and figures, some example implementations of an image processing systems and/or methods of image compression are described. Compression provides information encoded in an alternate format for purposes of transmitting or storing that information. For example, a text encoding scheme encodes alphanumeric characters and other symbols into binary sequences. Multimedia files are typically stored in compressed formats, such as the Joint Photographic Experts Group (JPEG) format for images or the Moving Pictures Experts Group (MPEG) format for videos. Compression techniques may be lossless (i.e., no loss of data integrity occurs during compression) or lossy (i.e., some allowable amount of data integrity is lost during compression). Despite the use of compression, multimedia files often occupy a large amount of digital storage space. In order to improve compression, inter-file compression may be used. In general, inter-file compression is used for managing large amounts of text-based data files and some techniques, such as Burrows-Wheeler Transform (BWT) routines, do not compress unfiltered color image data appropriately.

There are several methods for implementing inter-file compression of data. The first example method is chunking which divides a group of files into segments. Identical segments are stored only once, thereby reducing the space required to store redundant portions of the group of files. A second example method is delta compression which is based on the resemblance and delta among files. While both chunking and delta compression are useful for text-based data, these methods are not advantageous for compressing multimedia files. In particular, neither method provides any further compression for multimedia files.

Various examples described below relate to image compression for color images, in particular, lossless compression techniques. By filtering color image data appropriately, a block sorting technique that generally has an ability limited to sorting text data, may be used with color image data. In this manner, the benefits of block sorting techniques, such as BWT, are attainable with multiplanar color image data.

The terms "include," "have," and variations thereof, as used herein, mean the same as the term "comprise" or appropriate variation thereof. Furthermore, the term "based on," as used herein, means "based at least in part on." Thus, a feature that is described as based on some stimulus may be based only on the stimulus or a combination of stimuli including the stimulus. Furthermore, the term "maintain" (and variations thereof) as used herein means "to create, delete, add, remove, access, update, and/or modify."

Figure 1:
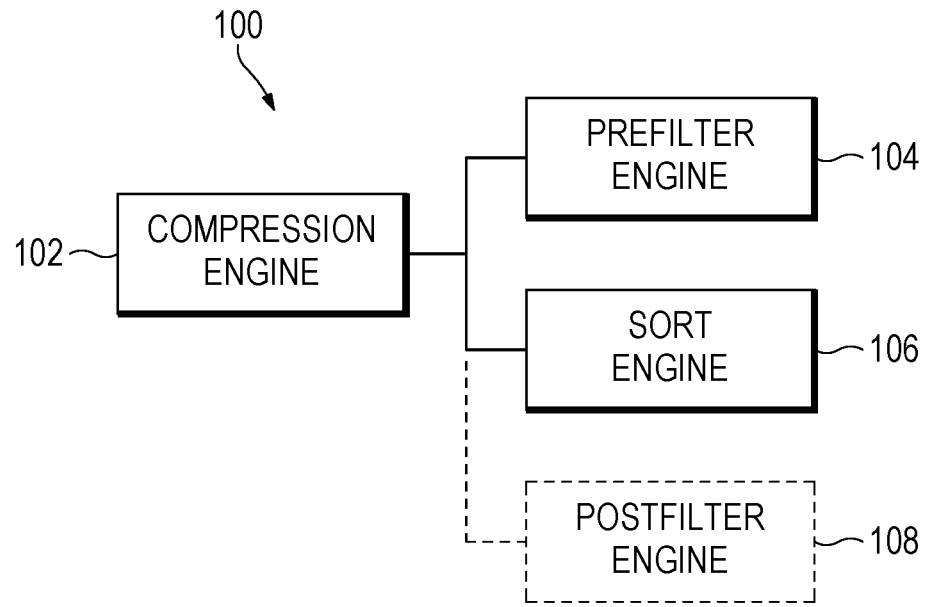
FIGS. 1 and 2 are block diagrams depicting example image processing systems.
Figure 2:
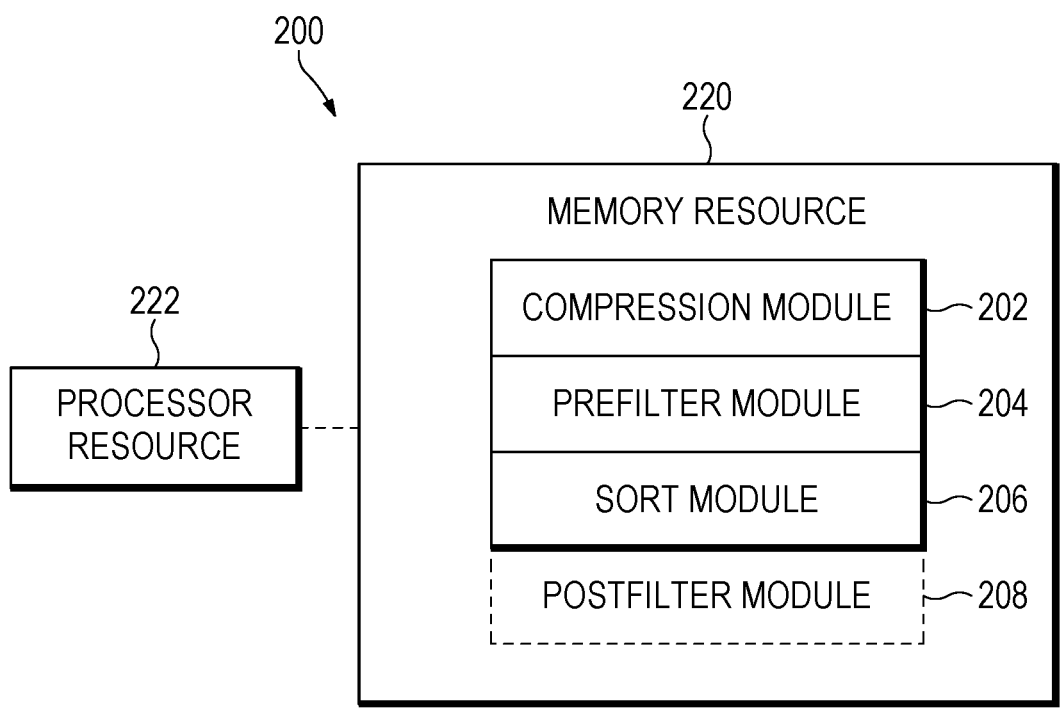

FIGS. 1 and 2 are block diagrams depicting example image processing systems 100 and 200. Referring to FIG. 1, the example image processing system 100 of FIG. 1 generally includes a compression engine 102, a prefilter engine 104, and a sort engine 106. In general, the compression engine 102 may provide a compressed version of the color image input data that has been filtered by the prefilter engine 104 and sorted by the sort engine 106. The example image processing system may include a postfilter engine 108 to provide filtering adaptive to the results of the sorting operations performed by the sort engine 106 before providing the compressed version of the color image data via the compression engine 102.

The compression engine 102 represents any circuitry or combination of circuitry and executable instructions to provide a version of the color image data compressed based on the relationships of data. The compression engine 102 utilizes the operations of the prefilter engine 104 and the sort engine 106 to transform the color image data based on the data relationships.

The prefilter engine 104 represents any circuitry or combination of circuitry and executable instructions to generate a stream of symbol patterns that can be analyzed sequentially based on color image data. For example, the prefilter engine 104 may be a combination of circuitry and executable instructions that sequentially analyzes regions of image data by neighborhood to identify relationships among the regions (e.g., color correlations) and produces a stream of symbols describing the regional relationships. Regional divisions of the image may be used based on the filtering and sorting routines used by the image processing system 100. For example, the color image data may be chunky encoded in tiles arranged as a first number rows of a second number of pixels and the tile size (e.g., the first number of rows of pixels and the second number of columns of pixels) may be tuned for a memory bounded environment or a compression demand (e.g., set a tile size above a compression threshold).

The data stream generated by the prefilter engine 104 includes image area representations that retain image information for a corresponding region. For example, if the target image area is a pixel, an example image area representation may be a pixel representation that includes an index to a neighbor pixel of a target pixel (the target pixel is the pixel represented by the pixel representation), a channel mask of the target pixel with reference to the neighbor pixel, and a sequence of non-null differences between the selected neighbor and the target pixel. More details regarding pixel representation and character sequences are described with reference FIG. 5B.

The prefilter engine 104 may be a combination of circuitry and executable instructions that identifies the regional information to place in the stream by analyzing a neighborhood of the pixel. A neighborhood of a pixel includes the pixels adjacent to the target pixel at any given point in the processing of the data stream. The prefilter engine 104 may classify a plurality of neighbor pixels in a neighborhood of the target pixel; rank the plurality of neighbor pixels; and select a neighbor pixel to encode in the stream from the plurality of neighbor pixels. For example, the prefilter engine 104 may analyze the neighborhood for a neighbor pixel with a number of components different with respect to the target pixel, such as a minimum number of components different from the target pixel and that pixel information may be placed in a pixel representation into a data stream by encoding the index of a selected neighbor pixel, a channel mask, and the sequence of non-differences into the pixel representation. The neighborhood of a target pixel may be limited to a subset of adjacent pixels. For example, the neighborhood may be limited to include already-scanned pixels (i.e., pixels already analyzed for pixel representation and/or placed into the data stream).

The prefilter engine 104 may classify and rank the neighbor pixels by determining a number of component matches of the neighbor pixel to the target pixel (e.g., a number of matches of color plane data where a component is a color plane of a color space of the color image data) and identifying a number of component differences of the non-matching components between the target pixel and the selected neighbor pixel. The prefilter engine 104 may generate a mask using the identified number of component differences. A channel mask may represent the differences between color planes of the reference, neighbor pixel to the target pixel. For example, a bit of the channel mask may represent a color plane of the target pixel being compressed with respect to the selected neighbor pixel. The prefilter engine 104 generates a sequence of non-null differences between the target pixel and the selected neighbor pixel by removing repeating characters, such as removing zeros. In an example, the sequence of non-null differences is appended to a header byte containing the selected neighbor pixel and the channel mask. More details regarding the pixel neighborhood and selecting a neighbor pixel are discussed with reference to FIGS. 4 and 5A.

The prefilter engine 104 may filter the input image data to produce a stream with relationship properties corresponding to the sorting operations performed by the sort engine 106. For example the stream generated by the prefilter engine 104 may be a spatially low correlated sequence of bytes where both the inter-pixel correlations and intra-pixel correlations have been used to encode neighboring pixel changes of neighbor image region data and the sort engine 106 may perform a lexicographic block sorting routine that divides the stream into a series of words compared to all rotations (such as a Duval algorithm to divide the input sequence into a series of Lyndon words put into a bijective BTW operation). As used herein, a "Lyndon word" is a nonempty string that is strictly smaller in lexicographic order than all of its rotations and lexicographic ordering generally entails placing the order of words based on alphabetical order of their component symbols.

The sort engine 106 represents any circuitry or combination of circuitry and executable instructions to perform a block sorting routine on the stream resulting from the prefilter engine 104. The block sorting routine uses relationships of data within the stream by factoring the input into a non-increasing sequence of words. For example, the block sorting algorithm is a lexicographic block sorting algorithm that reorganizes the data to create a stream based on frequency changes among words, such as a bijective BWT routine using Lyndon factorization also known as a Burrows-Wheeler Transform Scottified (BWTS). The sorted stream may be a nonempty string that is smaller in lexicographic order than all of its rotations.

The postfilter engine 108 represents any circuitry or combination of circuitry and executable instructions to perform a filter routine based on the relationships of data associated with the block sorting operation used by the sort engine 106. For example, the sort engine 106 may produce a lexicographically sorted output with high local correlation among words and the postfilter engine 108 may generate sequences using a encoding routine to convert the highly frequent patterns with fewer bits than the less occurring patterns, such as a run-length encoding routine that converts repeated consecutive elements in a single data value and count, Example encodings include a move-to-front transform, run-length encoding, and Fibonacci entropy encoding.

Figure 3:
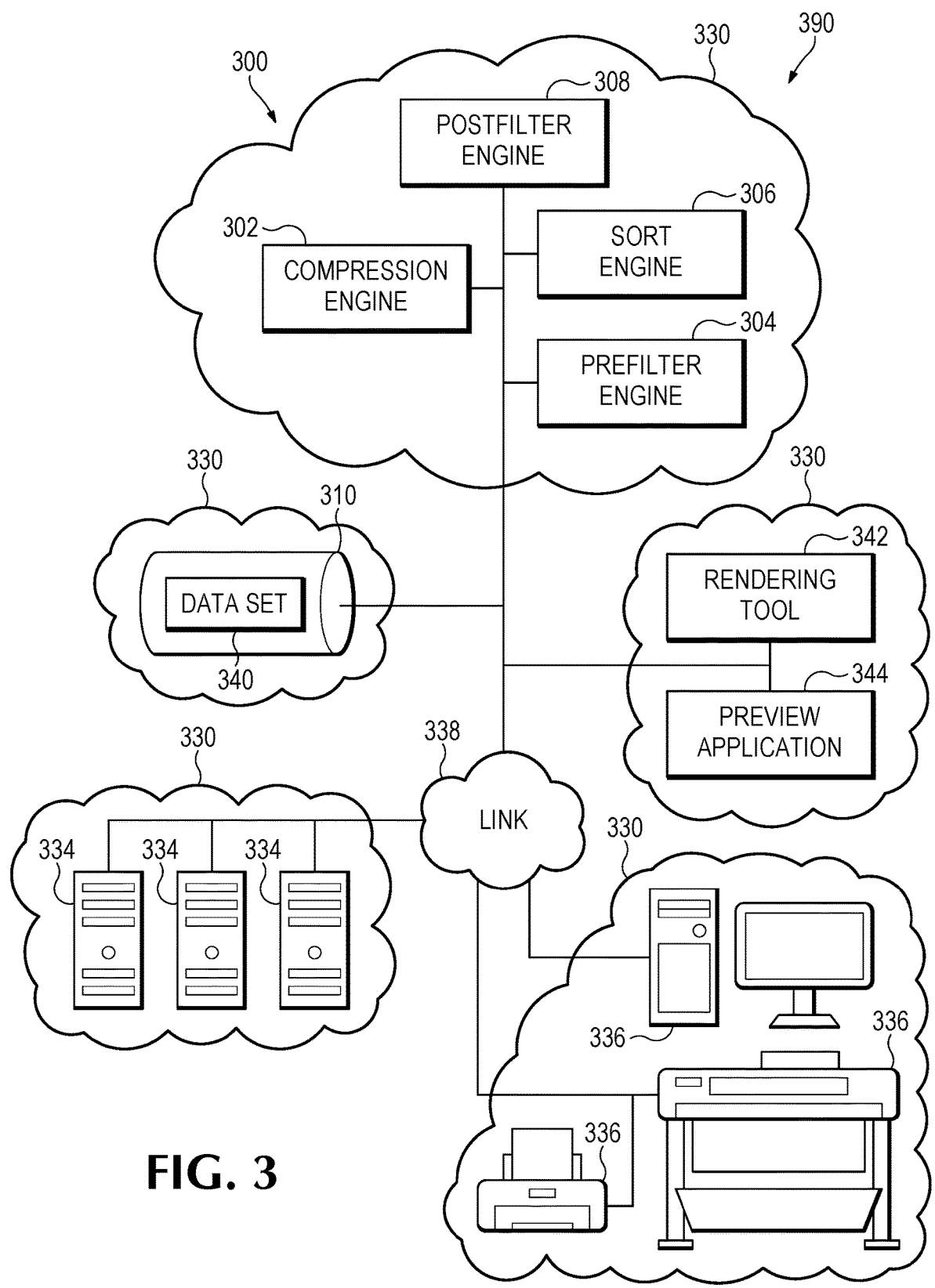
FIG. 3 depicts an example environment in which various image processing systems may be implemented.

In some examples, functionalities described herein in relation to any of FIGS. 1-3 may be provided in combination with functionalities described herein in relation to any of FIGS. 4-9.

FIG. 2 depicts the example system 200 may comprise a memory resource 220 operatively coupled to a processor resource 222. Referring to FIG. 2, the memory resource 220 may contain a set of instructions that are executable by the processor resource 222, The set of instructions are operable to cause the processor resource 222 to perform operations of the system 200 when the set of instructions are executed by the processor resource 222. The set of instructions stored on the memory resource 220 may be represented as a compression module 202, a prefilter module 204, a sort module 206, and a postfilter module 208. The compression module 202, the prefilter module 204, the sort module 206, and the postfilter module 208 represent program instructions that when executed function as the compression engine 102, the prefilter engine 104, the sort engine 106, and the postfilter engine 108 of FIG. 1, respectively. The processor resource 222 may carry out a set of instructions to execute the modules 202, 204, 206, 208, and/or any other appropriate operations among and/or associated with the modules of the system 200. For example, the processor resource 222 may carry out a set of instructions to convert input image data to a planar representation of a target image region based on previously-scanned neighbor image region data (where each pixel is encoded as a character sequence with a head byte representing an index of a reference neighbor and a channel mask), generate a stream with frequency changes that achieve a non-increasing threshold by rearrangement of each of the character sequences into a sorted lexicographic order (where the rearranged character sequence is smallest of the rotations of the pixel character sequences); filter the stream based on a data relationship among the character sequences; and provide a compressed version of the input image data using the stream filtered based on the data relationship among the character sequences. For another example, the processor resource 222 may carry out a set of instructions to divide the input image data into tiles arranges as a first number of rows of pixels and a second number of columns of pixels; select a neighbor pixel that has already been scanned and has a minimum number of components different form the other neighbor pixels; encode the index of the selected neighbor pixel and the channel mask with non-null delta into the head byte of the character sequence of the character sequence; rearranging the character sequences representing the color image data so that the stream is the smallest of rotations of the character sequences; and performing an encoding routine to filter the rearranged stream based on repeating patterns among the character sequences in the stream. For yet another example, the processor resource 222 may carry out a set of instructions to convert input image data to a planar representation of a target image region based on previously-scanned neighbor image region data, perform a bijective BWT by factoring input into a non-increasing sequence of Lyndon words (i.e., Lyndon factorization), generate encoded sequences using a variant of a run-length encoding routine having an arbitrary length limitation (i.e., an unconstrained length limitation to allow any number of lengths of sequences), perform a move-to-front transform routine on the generated encoded sequences, and perform an entropy encoding routine on the generated encoded sequences, such as a Fibonacci entropy encoding routine that generates variable-length bit sequences.

Figure 4:
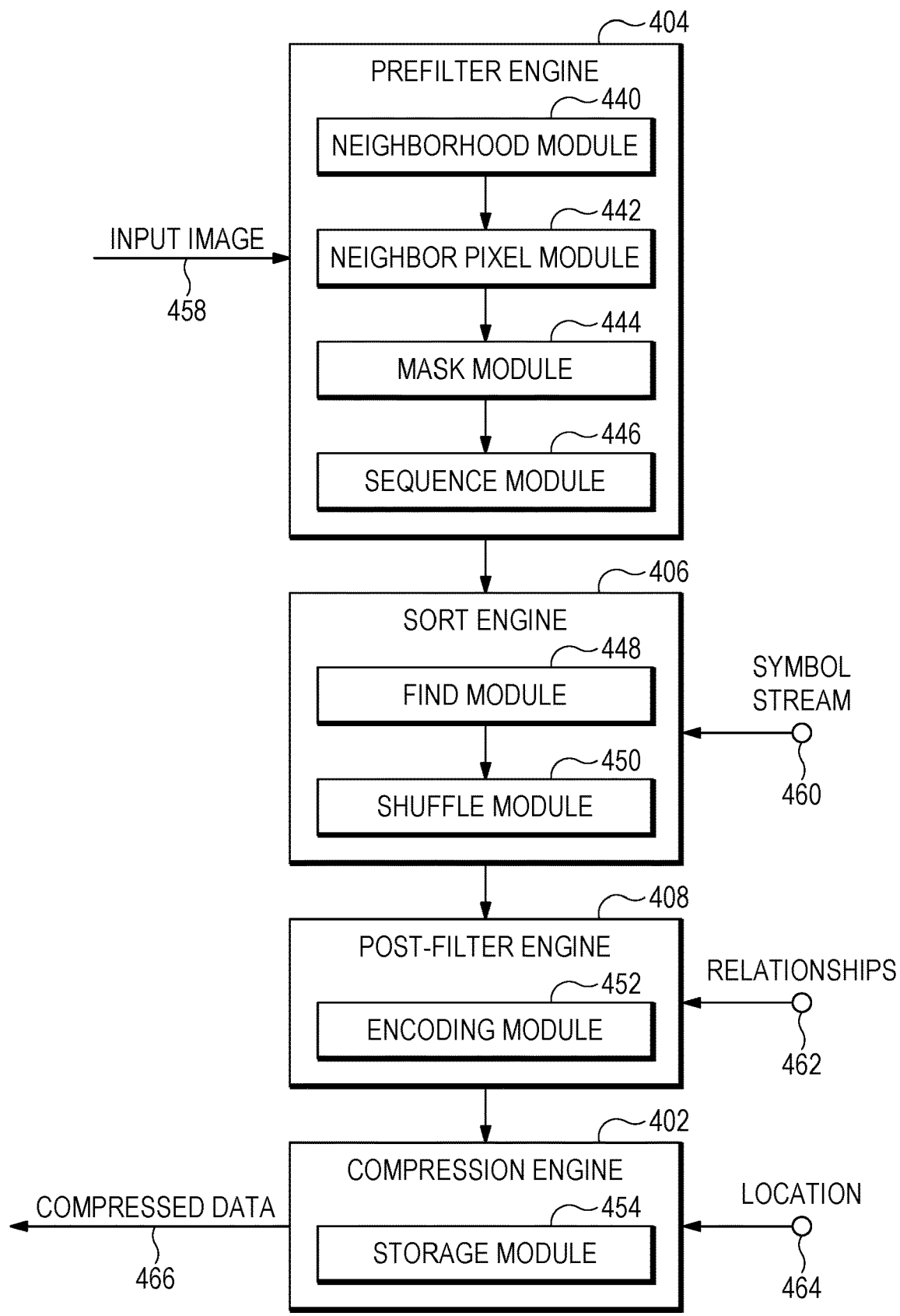
FIG. 4 depicts example modules used to implement example image processing systems.

Although these particular modules and various other modules are illustrated and discussed in relation to FIG. 2 and other example implementations, other combinations or sub-combinations of modules may be included within other implementations. Said differently, although the modules illustrated in FIG. 2 and discussed in other example implementations perform specific functionalities in the examples discussed herein, these and other functionalities may be accomplished, implemented, or realized at different modules or at combinations of modules. For example, two or more modules illustrated and/or discussed as separate may be combined into a module that performs the functionalities discussed in relation to the two modules. As another example, functionalities performed at one module as discussed in relation to these examples may be performed at a different module or different modules. FIG. 4 depicts yet another example of how functionality may be organized into modules.

The processor resource 222 is any appropriate circuitry capable of processing (e.g., computing) instructions, such as one or multiple processing elements capable of retrieving instructions from the memory resource 220 and executing those instructions. For example, the processor resource 222 may be a central processing unit (CPU) that enables image compression by fetching, decoding, and executing modules 202, 204, 206, and 208. Example processor resources include at least one CPU, a semiconductor-based microprocessor, a programmable logic device (PLD), and the like. Example PLDs include an application specific integrated circuit (ASIC), a field-programmable gate array (FPGA), a programmable array logic (PAL), a complex programmable logic device (CPLD), and an erasable programmable logic device (EPLD). The processor resource 222 may include multiple processing elements that are integrated in a single device or distributed across devices. The processor resource 222 may process the instructions serially, concurrently, or in partial concurrence.

The memory resource 220 represents a medium to store data utilized and/or produced by the system 200. The medium is any non-transitory medium or combination of non-transitory media able to electronically store data, such as modules of the system 200 and/or data used by the system 200. For example, the medium may be a storage medium, which is distinct from a transitory transmission medium, such as a signal. The medium may be machine-readable, such as computer-readable. The medium may be an electronic, magnetic, optical, or other physical storage device that is capable of containing (i.e., storing) executable instructions. The memory resource 220 may be said to store program instructions that when executed by the processor resource 222 cause the processor resource 222 to implement functionality of the system 200 of FIG. 2, The memory resource 220 may be integrated in the same device as the processor resource 222 or it may be separate but accessible to that device and the processor resource 222. The memory resource 220 may be distributed across devices.

In the discussion herein, the engines 102, 104, 106, and 108 of FIG. 1 and the modules 202, 204, 206, and 208 of FIG. 2 have been described as circuitry or a combination of circuitry and executable instructions. Such components may be implemented in a number of fashions. Looking at FIG. 2, the executable instructions may be processor-executable instructions, such as program instructions, stored on the memory resource 220, which is a tangible, non-transitory computer-readable storage medium, and the circuitry may be electronic circuitry, such as processor resource 222, for executing those instructions. The instructions residing on the memory resource 220 may comprise any set of instructions to be executed directly (such as machine code) or indirectly (such as a script) by the processor resource 222.

In some examples, the system 200 may include the executable instructions may be part of an installation package that when installed may be executed by the processor resource 222 to perform operations of the system 200, such as methods described with regards to FIGS. 4-9. In that example, the memory resource 220 may be a portable medium such as a compact disc, a digital video disc, a flash drive, or memory maintained by a computer device, such as a service device 334 of FIG. 3, from which the installation package may be downloaded and installed. In another example, the executable instructions may be part of an application or applications already installed. The memory resource 220 may be a non-volatile memory resource such as read only memory (ROM), a volatile memory resource such as random access memory (RAM), a storage device, or a combination thereof. Example forms of a memory resource 220 include static RAM (SRAM), dynamic RAM (DRAM), electrically erasable programmable ROM (EEPROM), flash memory, or the like. The memory resource 220 may include integrated memory such as a hard drive (HD), a solid state drive (SSD), or an optical drive, FIG. 3 depicts example environments in which various example image processing systems may be implemented. The example environment 390 is shown to include an example system 300 for compressing images. The system 300 (described herein with respect to FIGS. 1 and 2) may represent generally any circuitry or combination of circuitry and executable instructions to compress images by prefiltering the color image data to perform lexicographic block sorting. The system 300 may include a compression engine 302, a prefilter engine 304, a sort engine 306, and a postfilter engine 308 that are the same as the compression engine 102, the prefilter engine 104, the sort engine 106, and the postfilter engine 108 of FIG. 1, respectively, and the associated descriptions are not repeated for brevity. As shown in FIG. 3, the engines 302, 304, 306, and 308 may be integrated into a compute device, such as a print server. The engines 302, 304, 306, and 308 may be integrated via circuitry or as installed instructions into a memory resource of the compute device.

The example environment 390 may include compute devices, such as service devices 334 and user devices 336. The service devices 334 represent generally any compute devices to respond to a data request received from a user device 336, whether virtual or real. For example, the service device 334 may operate a combination of circuitry and executable instructions to provide a network packet in response to a request for a page or functionality of an application. The user devices 336 represent generally any compute devices to communicate a data request and receive and/or process the corresponding responses. For example, a browser application may be installed on the user device 336 to receive the network packet from the service device 334 and utilize the payload of the packet to display an element of a page via the browser application. For another example, a user device 336 may send image input to a rendering tool 342 to render the image into a printable format, such as a bitmap of color image data, and placed in a data store 310 for accessibility by user devices 336 and/or by a preview application 344 to view the rendered imaged. The data store 310 may contain information utilized by the engines 102, 104, 106, and 108. For example, the data store 310 may store data sets, such as input image data and a compressed version of image data.

The compute devices may be located on separate networks 330 or part of the same network 330. The example environment 390 may include any appropriate number of networks 330 and any number of the networks 330 may include a cloud compute environment. A cloud compute environment may include a virtual shared pool of compute resources. For example, networks 330 may be distributed networks comprising virtual computing resources. Any appropriate combination of the system 300 and compute devices may be a virtual instance of a resource of a virtual shared pool of resources. The engines and/or modules of the system 300 herein may reside and/or execute "on the cloud" (e.g., reside and/or execute on a virtual shared pool of resources).

A link 338 generally represents one or a combination of a cable, wireless connection, fiber optic connection, or remote connections via a telecommunications link, an infrared link, a radio frequency link, or any other connectors of systems that provide electronic communication. The link 338 may include, at least in part, intranet, the Internet, or a combination of both. The link 338 may also include intermediate proxies, routers, switches, load balancers, and the like.

Referring to FIGS. 1-3, the engines 102, 104, 106, and 108 of FIG. 1 and/or the modules 202, 204, 206, and 208 of FIG. 2 may be distributed across devices 334, 336, or a combination thereof. The engine and/or modules may complete or assist completion of operations performed in describing another engine and/or module. For example, the compression engine 302 of FIG. 3 may request, complete, or perform the methods or operations described with the compression engine 102 of FIG. 1 as well as the prefilter engine 104, the sort engine 106, and the postfilter engine 108 of FIG. 1. Thus, although the various engines and modules are shown as separate engines in FIGS. 1 and 2, in other implementations, the functionality of multiple engines and/or modules may be implemented as a single engine and/or module or divided in a variety of engines and/or modules. In some example, the engines of the system 300 may perform example methods described in connection with FIGS. 4-9.

FIG. 4 depicts example modules used to implement example image processing systems. Referring to FIG. 4, the example modules of FIG. 4 generally include a compression engine 402, a prefilter engine 404, a sort engine 406, and a postfilter engine 408 that are similar to the compression engine 102, the prefilter engine 104, the sort engine 106, and the postfilter engine 108. For brevity, the appropriate descriptions have not been repeated in their entirety. The example modules of FIG. 4 may be implemented on a compute device, such as a print apparatus or a data server. As used herein, a "print apparatus" may be a device to print content on a physical medium (e.g., paper or a layer of powder-based build material, etc.) with a print material (e.g., ink or toner). For example, the print apparatus may be a wide-format print apparatus that prints latex-based print fluid on a print medium, such as a print medium that is size A2 or larger. In the case of printing on a layer of powder-based build material, the print apparatus may utilize the deposition of print materials in a layer-wise additive manufacturing process. A print apparatus may utilize suitable print consumables, such as ink, toner, fluids or powders, or other raw materials for printing. In some examples, a print apparatus may be a three-dimensional (3D) print apparatus. An example of fluid print material is a water-based latex ink ejectable from a print head, such as a piezoelectric print head or a thermal inkjet print head. Other examples of print fluid may include dye-based color inks, pigment-based inks, solvents, gloss enhancers, fixer agents, and the like.

The prefilter engine 404 receives input image data 458. The prefilter engine 404 includes a neighborhood module 440, a neighbor pixel module 442, a mask module 444, and a sequence module 446 to assist preparing color image data for being sorted. The neighborhood module 440 represents program instructions that, upon execution, cause a processor to identify a pixel information of each of the pixels in the neighborhood of a target pixel. For example, the neighborhood module 440 may, when executed, cause a processor to identify the color components of each of the already scanned pixels adjacent to the target pixel. The neighbor pixel module 442 represents program instructions that, upon execution, cause a processor to select a neighbor pixel in the neighborhood of the target pixel. For example, the neighbor pixel module 442 may, when executed, cause a processor to classify each of the pixels in the neighborhood by color components, rank the pixels of the neighborhood based on the number of matching color components, and select a pixel from the neighborhood that achieves the threshold number of matching color components (e.g., a maximum number of matching color components). The mask module 444 represents program instructions that, upon execution, cause a processor to generate a mask representative of the color components (e.g., color planes) that are different between the target pixel and the neighbor pixel identified by processor execution of the neighbor pixel module 442. The sequence module 446 represents program instructions that, upon execution, cause a processor to generate a sequence of non-null deltas such as a sequence of non-null residuals converted to a monotonically vanishing distribution. The prefilter engine 404 places the index of the neighbor pixel, the mask, and the sequence of non-null residuals into a symbol stream 460 provided to the sort engine 406.

The sort engine 406 of FIG. 4 includes a find module 448 and a shuffle module 450 to assist sorting of the symbol stream 460. The find module 448 represents program instructions that, upon execution, cause a processor to convert the symbol stream 460 into a sequence of words. For example, the find module 448, when executed, may cause a processor to factor the stream 460 into a non-increasing sequence of Lyndon words using a Duval algorithm. The shuffle engine 450 represents program instructions that, upon execution, cause a processor to sort the rotations of the words identified by the processor executing the find module 448. The sort engine 406 may then identify a string using the sorted list, such as by executing instructs to cause a processor resource to pick a character (e.g., the last character) from each string in the sorted list.

The postfilter engine 408 of FIG. 4 may include an encoding module 452 to assist filtering data after the data has been sorted. The encoding module 452 represents program instructions that, upon execution, cause a processor to perform an encoding operation on the character sequences provided by the sort engine 406 (e.g., a stream resulting from the sorting modifications to the stream 460). The encoding module 452, when executed may cause a processor to, for example, perform a variant of Packbits run-length encoding routine with unconstrained lengths, perform a move-to-front transform routine applied to the symbol runs (e.g., to rename symbols in order to use frequency labels for recently used symbols), and a Fibonnaci entropy encoding routine (e.g., entropy encoding that generates a variable-length bit sequence such that frequent symbols or labels get shorter sequences) to further compress the sorted color image data. The postfilter engine 408 may use the data relationships 462 derived from sorting the symbol stream 460 to select an encoding routine to exploit the data patterns for compression.

The compression engine 402 of FIG. 4 includes a storage module 454 to assist providing the compressed data 466 to a location 464. The storage module 454 represents program instructions that, upon execution, cause a processor to identify a location 464 to store the compressed version 466 of the color image data.

Figure 5A:
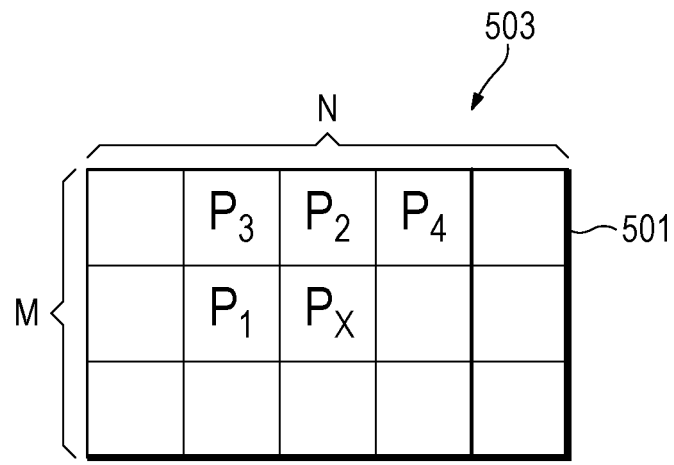
FIGS. 5A-5D depict example compression operations.

FIGS. 5A-5D depict example compression operations, Referring to FIG. 5A, a series of pixels are shown in a tile of a first number of rows (M) and a second number of columns (N). $P_X$ is the target pixel and pixels $P_1$, $P_2$, $P_3$, and $P_4$ are adjacent neighbor pixels in the neighborhood of $P_X$ that have already been scanned in an implementation that sequentially reviews pixels to place pixel data into a stream. In other words, the identified neighbor pixels are used because the pixels meet the criteria of being adjacent to the target pixel $P_X$ and already processed.

Figure 5B:
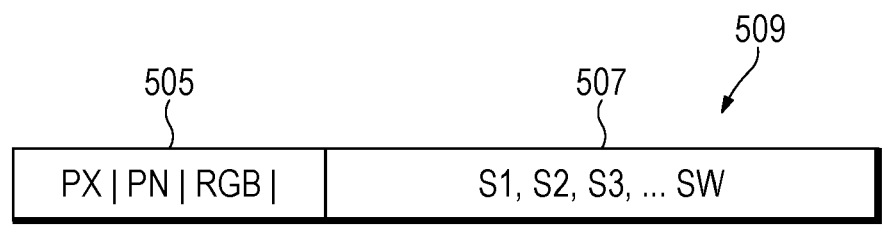

FIG. 5B depicts an example pixel representation 509 within a data stream of color image data. Block 505 represents the header information of the pixel representation including the neighbor pixel index (PN) and the mask (RGB). Block 507 represents the sequence of non-null deltas of color components between the target pixel and the selected neighbor pixel. The mask may have reference to color components of a color model. A color model may define a color space, i.e., a multi-dimensional space with dimensions of the space representing variables within the color model and a point in the multi-dimensional space representing a color value. For example, in a red, green, blue (RGB) color space, an additive color model defines three variables representing different quantities of red, green and blue light. Another color space includes a cyan, magenta, yellow and black (CMYK) color space, in which four variables are used in a subtractive color model to represent different quantities of colorant or ink, e.g., for a print system and an image with a range of different colors can be printed by overprinting images for each of the colorants or inks. Yet other examples include: the International Commission on Illumination (CIE) 1931 XYZ color space, in which three variables ('X', 'Y' and 'Z' or tristimulus values) are used to model a color; the CIE 1976 (L*, a*, b*-CIELAB or 'LAB') color space, in which three variables represent lightness (l') and opposing color dimensions ('a' and 'b'); and the Yu'v' color space, in which three variables represent the luminance ('Y') and two chrominance dimensions (u' and v').

Figure 5C:
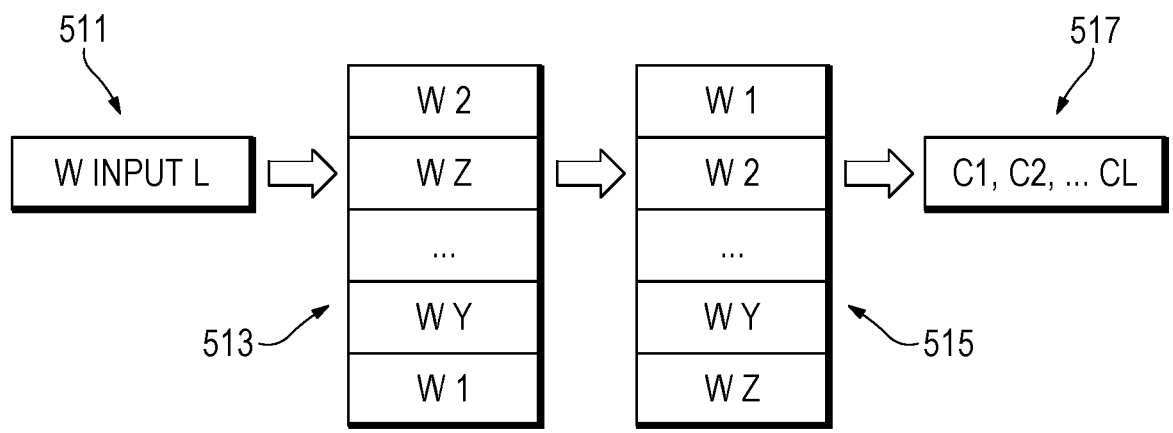

FIG. 5C depicts an example sorting routine. Starting with an input W of length L at state 511. The sorting routine generates a number of variations (e.g., rotations) of the input W at state 513 and then sorts the rotations lexicographically at state 515. Then, a transformed string is obtained by picking the final character of each string in the sorted list. For example as shown at state 517 of FIG. 5C, an output is taken from the sorted variations by choosing a character set from each of the first subset of variations until all the character sets have been identified which results in output of length L but with the characters of W in a different order (depicted as C1, C2, . . . , CL of FIG. 5C.

Figure 5D:
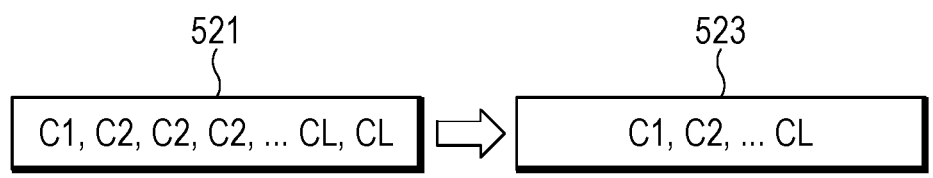

FIG. 5D depicts encoding a first character set 521 by removing repeating patterns of characters to generate a compressed, second character set 523.

Figure 6:
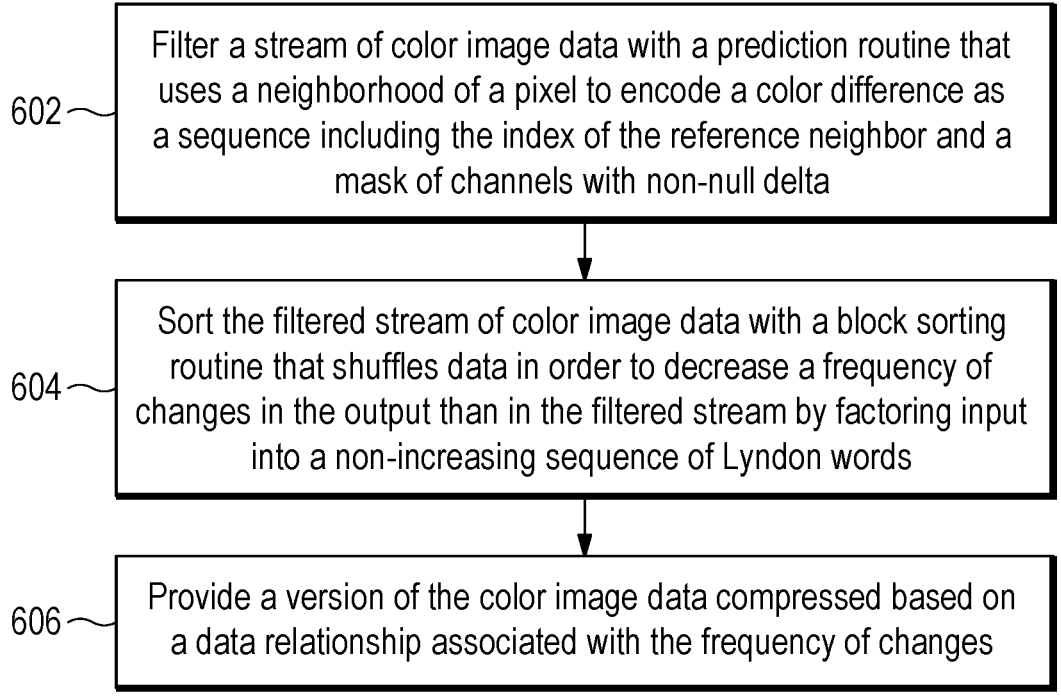
FIGS. 6-9 are flow diagrams depicting example methods of image compression.

FIGS. 6-9 are flow diagrams depicting example methods of image compression, such as lossless compression. Referring to FIG. 6, example methods of image compression may generally comprise filtering a stream of color image data with a prediction routine that uses a neighborhood of a pixel to encode a color difference, sorting the filtered stream of color image data with a block sorting routine, and providing a version of the color image data compressed based on a data relationship associated with data patterns from the block sorting routine. The methods described with reference to FIGS. 6-9 are performable by engines of image processing systems discussed with reference to FIGS. 1-4, such as the compression engine 102, the prefilter engine 104, the sorting engine 106, and the postfilter engine 108 of FIG. 1.

At block 602, a stream of color image data is filtered with a prediction routine that uses a neighborhood of a pixel to encode a color difference. The color difference may be encoded as a character sequence including the index of the reference neighbor pixel and a mask of color channels with non-null delta. The prediction routine may use a neighborhood of already-scanned pixels to identify the neighbor pixel to use as a reference. The stream of color image data may increase in size by adding the index of the reference neighbor and the channel mask to the encoding along with a complementary sequence of zero or more non-null residuals converted to a monotonically vanishing distribution, for example. Synthetic neighborhoods may be used for particular pixels, such as edge or corner pixels that do not include at least four already scanned neighbor pixels. The filtering operations at block 602 are performable by a prefilter engine, such as the prefilter engine 104 of FIG. 1.

At block 604, the filtered stream of color image data is sorted with a block sorting routine that shuffles data in order to decrease a frequency of changes in an output stream than in the filtered stream by factoring input into a non-increasing sequence of Lyndon words. The sorting operations at block 604 are performable by a sorting engine, such as the sorting engine 106 of FIG. 1.

At block 606, a compressed version of the color image data is provided to a destination. The version of the color image data is compressed based on the data relationship associated with the frequency of changes exploited by the sorting routine performed at block 604 (and prepared into the stream by the filtering at block 602). The operations at block 606 are performable by a compression engine, such as compression engine 102 of FIG. 1.

Figure 7:
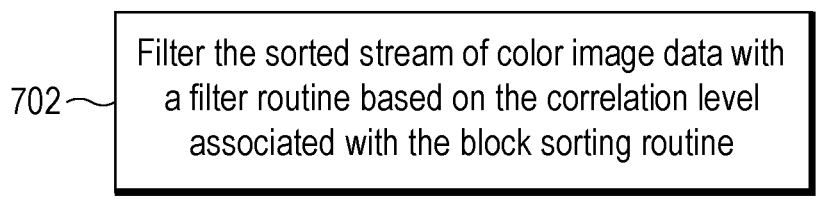

The methods of FIGS. 7-9 may be used in any combination thereof and in conjunction with the method described with reference to FIG. 6. Referring to FIG. 7, the sorted stream of color image data may be filtered with a filter routine based on the correlation level associated with the block sorting routine. For example, the correlations developed by the prefiltering at block 602 and the sorting at block 604 of FIG. 6 may be generated for use with the postfiltering routines at block 702. For example, a Packbits variant of a run-length encoding technique may be used to identify and utilize series of repeated bytes, the literal values are transformed by a move-to-front transform technique (e.g., each symbol in the data is replaced by its index in the stack of recently used symbols), and both run lengths and literals are entropy-encoded using Fibonacci encoding (where each symbol code is uniquely decomposed as a sum of Fibonacci numbers and a Fibonacci bit sequence is emitted with the mask of Fibonacci numbers used in little-endian bit order, for example), in the previous example, the move-to-front transform routine may not change the amount of data encoded by the run-length encoding variant, but may filter the run-length encoded character sets for preparation to be encoded by the entropy encoding routine. In other examples, the encoding routines may be performed in a different order or combination of operations. The filtering operations of block 702, such as encoding routines, are performable by a postfilter engine, such as the postfilter engine 108 of FIG. 1.

Figure 8:
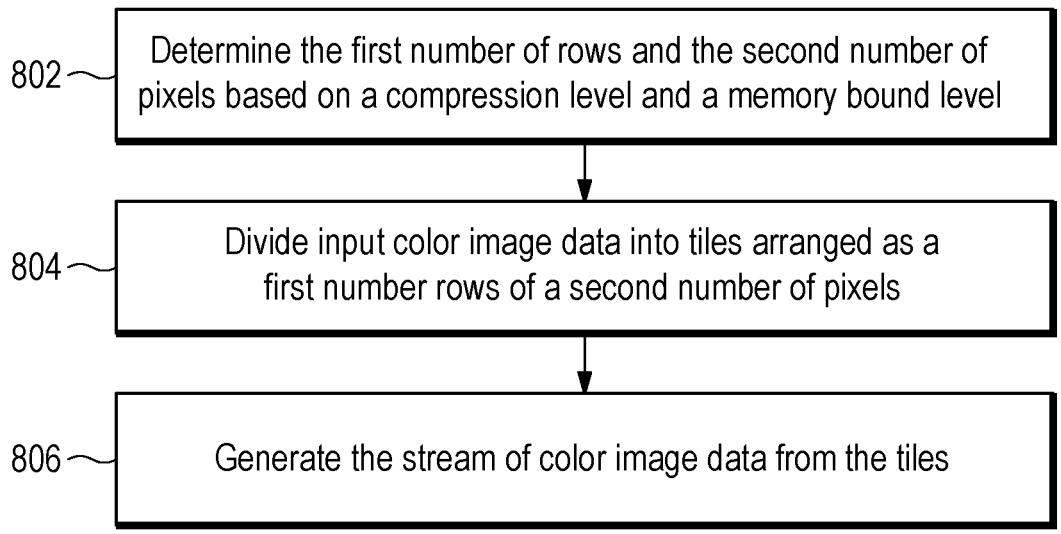

Referring to FIG. 8, the input color image data may be prepared for compression by separating the color image data into portions. At block 802, a tile size is identified by determining a first number of pixels (e.g., rows) and a second number of pixels (e.g., columns) based on a compression level and/or a memory bound level. For example, a system or use may require a particular level of compression or may be restricted to a particular amount of memory and the tile size may be determined by identifying a number of rows and a number of columns to use with each tile based on the restrictions. The input color image data is divided into tiles at block 804 of the size determined at block 802 and, at block 806, the stream of color image data to use with block 602 is generated from the tiles. The tile size determination operations are performable by a compression engine or a prefilter engine, such as compression engine 102 or the prefilter engine 104 of FIG. 1.

Figure 9:
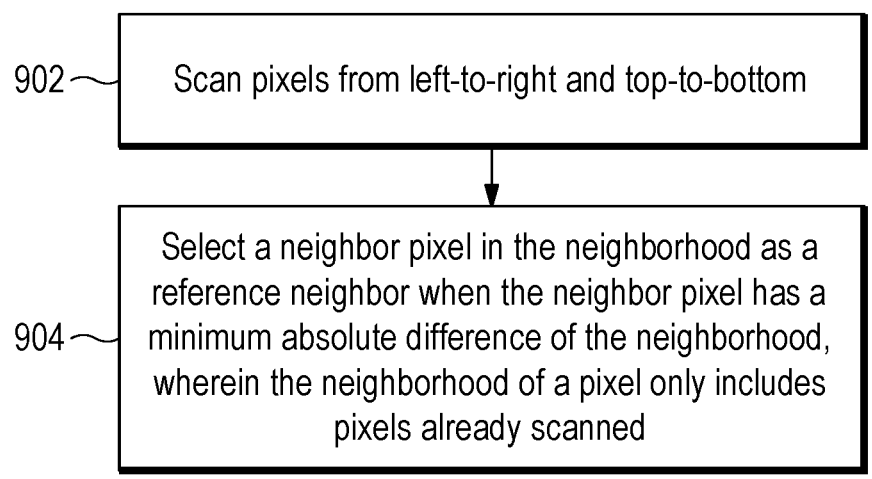

Referring to FIG. 9, the neighborhood of pixels used to encode a particular target pixel may be restricted to only pixels that have already been processed (i.e., already-scanned pixels.) At block 902, pixels are scanned from left-to-right and top-to-bottom. At block 904, a neighbor pixel in the neighborhood is selected as a reference neighbor when the neighbor pixel has a minimum absolute difference of the neighborhood in comparison to the color components of the target pixel. The neighborhood operations are performable by a prefilter engine, such as the prefilter engine 104 of FIG. 1. By adding a mask based on the selected neighbor pixel that is closest in color to the target pixel to generate a stream of color image data, a lexicographic block sorting routine may sort the stream of color image data to perform at a beneficial compression rate in comparison to color image data that has not been prefiltered with neighbor pixel and channel mask information.

Although the flow diagrams of FIGS. 4-9 illustrate specific orders of execution, the order of execution may differ from that which is illustrated. For example, the order of execution of the blocks may be scrambled relative to the order shown. For another example, the order of execution may be in reverse, such as for decompression of data compressed by the methods described herein. Also, the blocks shown in succession may be executed concurrently or with partial concurrence. All such variations are within the scope of the present description.

All of the features disclosed in this specification (including any accompanying claims, abstract and drawings), and/or all of the elements of any method or process so disclosed, may be combined in any combination, except combinations where at least some of such features and/or elements are mutually exclusive.

The present description has been shown and described with reference to the foregoing examples. It is understood, however, that other forms, details, and examples may be made without departing from the spirit and scope of the following claims. The use of the words "first," "second," or related terms in the claims are not used to limit the claim elements to an order or location, but are merely used to distinguish separate claim elements.

What is claimed is:

1. An image processing system comprising:
a prefilter engine to generate, based on color image data, a stream of symbol patterns that can be analyzed sequentially, wherein a pixel representation in the stream includes:
an index to a neighbor pixel of a target pixel, the target pixel represented by the pixel representation;
a channel mask of the target pixel with reference to the neighbor pixel; and
a sequence of non-null differences between the selected neighbor and the target pixel;
a sort engine to perform, on the stream, a block sorting routine that uses relationships of data within the stream by factoring the input into a non-increasing sequence of words; and
a compression engine to provide a version of the color image data compressed based on the relationships of data.

2. The system of claim 1, wherein:
the target image area is a pixel;
the prefilter engine is to:
classify a plurality of neighbor pixels in a neighborhood of the target pixel;
rank the plurality of neighbor pixels;
select, from the plurality of neighbor pixels, the neighbor pixel that has a minimum number of components different with respect to the target pixel; and
encode the index of the selected neighbor pixel, the channel mask and the sequence of non-null differences into the pixel representation; and
the sorted stream is a nonempty string that is smaller in lexicographic order than all of its rotations.

3. The system of claim 2, wherein a bit of the mask represents a color plane of the target pixel being compressed with respect to the selected neighbor and the prefilter engine:
determines a number of component matches of the neighbor pixel to the target pixel;
identifies a number of component differences of the non-matching components between the target pixel and the selected neighbor pixel;
generates a mask using the identified number of component differences; and
generates a sequence of non-null differences between the target pixel and the selected neighbor pixels by removing zeros.

4. The system of claim 1, wherein:
the stream generated by the prefilter engine is a spatially low correlated sequence of bytes where both the inter-pixel correlations and intra-pixel correlations have been used to encode neighboring pixel changes of neighbor image region data.

5. The system of claim 1, wherein:
the block sorting routine is bijective and divides the stream into a series of words compared to all rotations;
the color image data is chunky encoded in tiles arranged as a first number rows of a second number of pixels; and
a tile size is tuned for a memory bounded environment or a compression demand above a threshold.

6. The system of claim 1, further comprising:
a postfilter engine to perform a filter routine based on the relationships of data associated with the block sorting operation.

7. The system of claim 6, wherein:
the sorting routine includes a Burrow-Wheeler Transform operation; and the filter routine includes a move-to-front transform operation with run-length encoding.

8. A non-transitory computer-readable storage medium comprising a set of instructions executable by a processor resource to:

convert input image data to a planar representation of a target image region based on previously-scanned neighbor image region data, each pixel encoded as a character sequence with a head byte representing an index of a reference neighbor and a channel mask;

generate a stream with frequency changes that achieve a non-increasing threshold by rearrangement of each of the character sequences into a sorted lexicographic order where the rearranged character sequence is smallest of the rotations of the character sequences;

filter the stream based on a data relationship among the character sequences; and provide a compressed version of the input image data using the stream filtered based on the data relationship among the character sequences.

9. The medium of claim 8, wherein the set of instructions is executable by the processor resource to:

divide the input image data into tiles arranged as a first number of rows of pixels and a second number of columns of pixels;

select a neighbor pixel that has already been scanned and has a minimum number of components different from the other neighbor pixels; and encode the index of the selected neighbor pixel and the channel mask with non-null delta into the head byte of the particular character sequence.

10. The medium of claim 9, wherein the set of instructions is executable by the processor resource to:

perform a bijective Burrows-Wheeler transform by factoring input into a non-increasing sequence of Lyndon words;

generate encoded sequences using a run-length-encoding routine having an unconstrained length limitation;

perform a move-to-front transform on the generated encoded sequences; and perform an entropy encoding routine on the generated encoded sequences.

11. A method of image compression comprising:

filtering a stream of color image data with a prediction routine that uses a neighborhood of a pixel to encode a color difference as a sequence including the index of the reference neighbor and a mask of channels with non-null delta, the neighborhood including pixels already scanned;

sorting the filtered stream of color image data with a block sorting routine that shuffles data in order to decrease a frequency of changes in an output stream than in the filtered stream by factoring input into a non-increasing sequence of Lyndon words; and providing a version of the color image data compressed based on a data relationship associated with the frequency of changes.

12. The method of claim 11, comprising:

filtering the sorted stream of color image data with a filter routine based on the correlation level associated with the block sorting routine.

13. The method of claim 12, comprising:

dividing input color image data into tiles arranged as a first number rows of a second number of pixels;

generating the stream of color image data from the tiles.

14. The method of claim 13, comprising:

determining the first number of rows and the second number of pixels based on a compression level and a memory bound level.

15. The method of claim 13, comprising:

scanning pixels from left-to-right and top-to-bottom; and selecting a neighbor pixel in the neighborhood as a reference neighbor when the neighbor pixel has a minimum absolute difference of the neighborhood, wherein the neighborhood of a pixel only includes pixels already scanned.

* * * * *